(12) United States Patent
Sabbavarapu et al.

(10) Patent No.: US 6,815,977 B2
(45) Date of Patent: Nov. 9, 2004

(54) SCAN CELL SYSTEMS AND METHODS

(75) Inventors: Anil K. Sabbavarapu, Austin, TX (US); Talal K. Jaber, Austin, TX (US); Grant W. McFarland, Austin, TX (US); Paven R. Sunkerneni, San Jose, CA (US); David M. Wu, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 10/328,203

(22) Filed: Dec. 23, 2002

(65) Prior Publication Data

US 2004/0119501 A1 Jun. 24, 2004

(51) Int. Cl.$^7$ ............................................... H03K 19/00
(52) U.S. Cl. ............................. 326/16; 326/93; 714/726
(58) Field of Search ...................... 326/16, 93; 327/202, 327/203; 714/726, 727

(56) References Cited

U.S. PATENT DOCUMENTS 5,898,330 A * 4/1999 Klass ........................ 327/210
5,978,944 A * 11/1999 Parvathala et al. ......... 714/726
6,560,737 B1 * 5/2003 Colon-Bonet et al. ...... 714/726

* cited by examiner

Primary Examiner—James H. Cho
(74) Attorney, Agent, or Firm—Buckley, Maschoff & Talwalkar LLC

(57) ABSTRACT

According to some embodiments, a circuit includes a Domino state element, a master latch to receive a first clock signal and to store a value in the Domino state element in response to the first clock signal, and a slave latch to receive a second clock signal and to output the value in response to the second clock signal. Some embodiments provide a first state element coupled to a first node, a master latch coupled to the first state element, the master latch to receive a first storage signal, a first load signal, a first clock signal and a first scan value signal, a second state element coupled to a second node, the second node sequential to the first node, and a slave latch coupled to the second state element, the slave latch to receive a second storage signal, a second load signal, a second clock signal and a second scan value signal.

20 Claims, 9 Drawing Sheets

US 6,815,977 B2

SCAN CELL SYSTEMS AND METHODS

BACKGROUND

A conventional integrated circuit (IC) may include millions of logic gates. Each of these logic gates must be properly fabricated in order for the IC to operate as designed. Testing techniques have therefore been developed to ensure that the logic gates of an IC have been properly fabricated and that the gates provide proper functioning to the IC.

Some testing techniques utilize scan circuits that are built into an IC exclusively for testing purposes. An IC may include many functional logic circuits separated by associated state elements. A state element stores values that are produced by its associated logic circuit under the control of a system clock. Scan circuits are coupled to these state elements so as to store test data, or scan values, directly into the state elements and to read out values stored by the state elements.

In operation, scan values are determined using Automatic Test Pattern Generation (ATPG) techniques or the like. These values are stored into state elements that are associated with functional logic circuits to be tested. The system clock is activated for a predetermined amount of cycles based on the test being performed so as to allow the stored values to propagate through the functional logic. Next, the scan circuits are controlled so as to capture values that are stored in state elements of interest. The captured values may then be compared with expected values to determine whether the functional logic circuits operated properly.

Scan circuits have conventionally been used in conjunction with static functional circuits. These static circuits include traditional static complementary metal-oxide semiconductor (CMOS) logic, flip-flops and latches. However, ICs often include other types of functional circuits. One such circuit type is the Domino circuit. A Domino circuit is a dynamic circuit that is pre-charged and evaluated rather than traditionally clocked. Domino circuits often provide speed advantages over static circuits but may require more die space than a corresponding static circuit. As a result, Domino circuits are often used to provide functions for which speed is of primary importance.

FIG. 1 illustrates a set-dominant latch (SDL) used in some Domino circuits. SDL 1 is a state element of a Domino circuit and therefore provides functionality similar to a state element of a static circuit. Generally, SDL 1 latches a data value present on the Data signal line in response to an active Clk signal. As a result, the latched data value is present on output signal line Q. The data value that is present on the Data signal line is usually generated by functional logic associated with SDL 1.

Scan circuits used in conjunction with static functional logic circuits are not suitable for Domino-based functional logic circuits. As a result, functional patterns are conventionally used to test Domino circuits. More specifically, data values are applied to the input pins of an IC under test and allowed to propagate through the IC. Output pins are then examined to determine whether the data values propagated properly. Testing using functional patterns is often much less efficient and effective than scan-based testing using ATPG scan values.

Scan values may be input to an IC by automatic test equipment (ATE). The I/O speed of such test equipment is not suitable for use in conjunction with many modern ICs, including microprocessors and application-specific ICs. ATE I/O speeds therefore result in long test times that increase as the amount of test data increases. The test speed is limited to the ATE I/O speed even if (as is usually the case) an IC under test is capable of processing the test data at much higher speeds. The long test times limit the number of ICs that can be tested in a given period and thereby limit IC production throughput.

Scan circuits offer efficient and effective testing at the expense of IC die area. Accordingly, it is desirable to reduce a size of current scan circuits while still maintaining their functionality. One useful type of conventional scan circuit is illustrated in FIG. 2. Hold scan circuit 10 provides the functionality described above with respect to other scan circuits and also provides independence between the scan path and the functional logic path. Consequently, hold scan circuit 10 may store a value in state element 15 while functional logic associated with state element 15 is being clocked. Hold scan circuit 10 may also capture a value stored in state element 15 at any time while the functional logic is being clocked. Despite these features, hold scan circuit 10 is often unsuitable for particular applications because of the significant amount of IC die space required by its elements.

DETAILED DESCRIPTION

Figure 1:
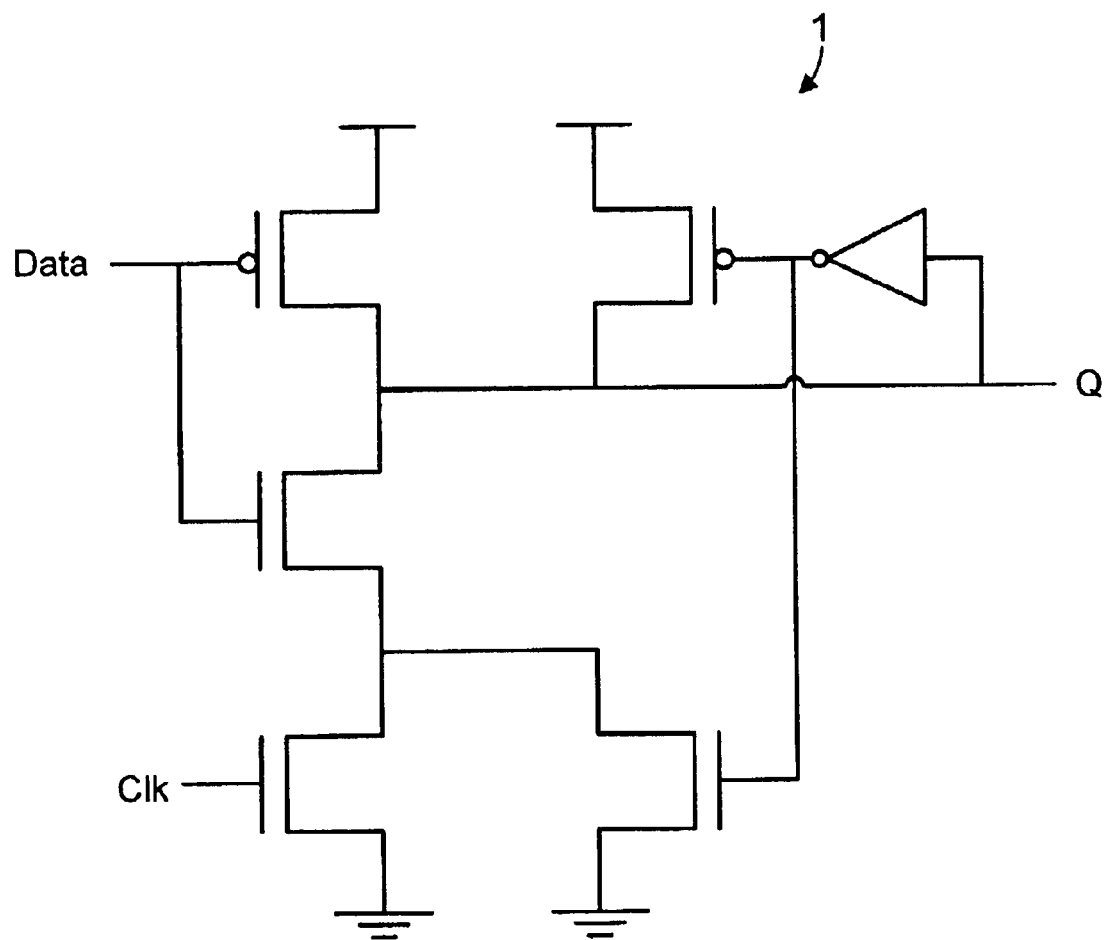
FIG. 1 is a diagram of a conventional Domino SDL.
Figure 2:
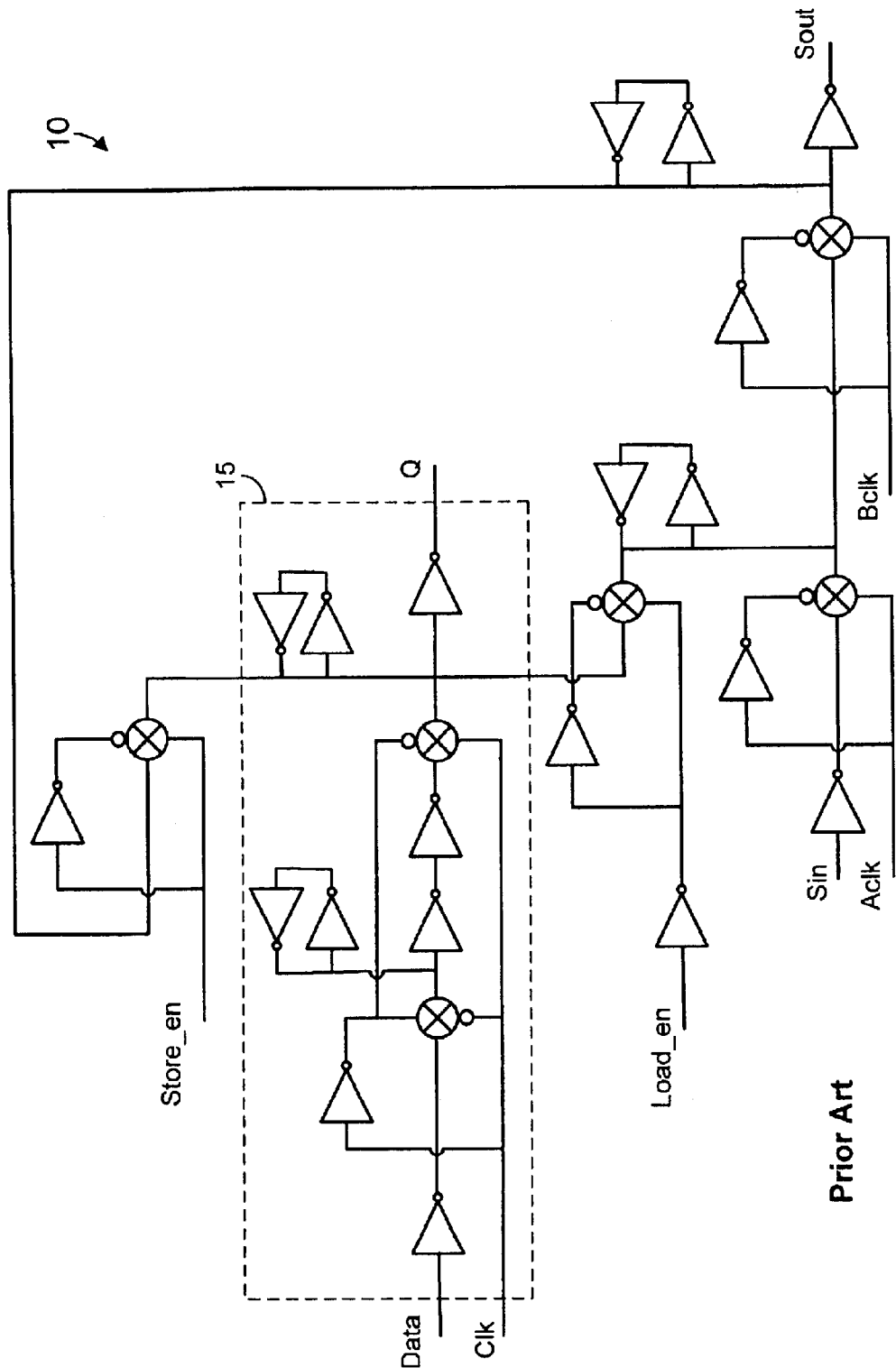
FIG. 2 is a diagram of a conventional hold scan circuit.
Figure 3:
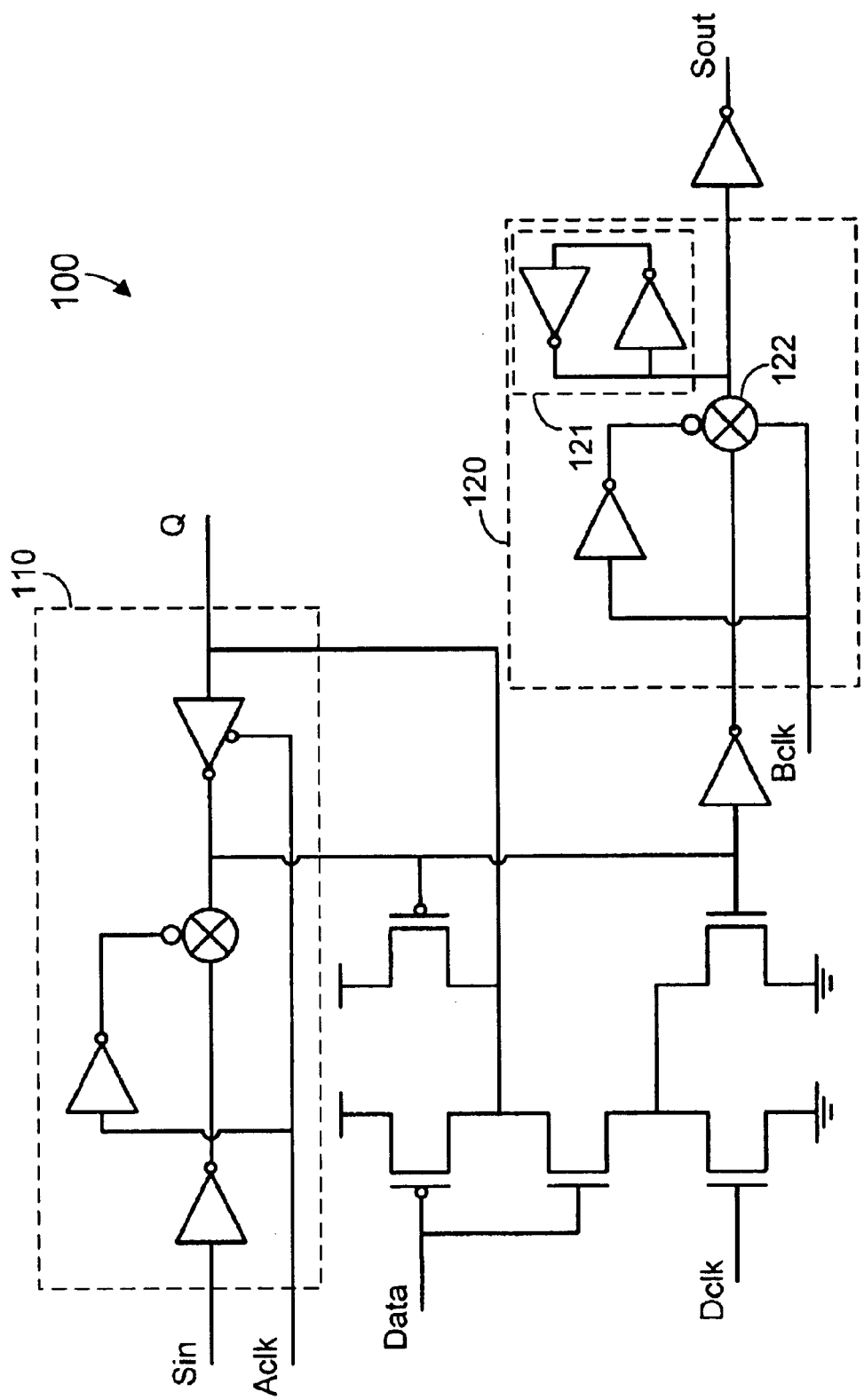
FIG. 3 is a diagram of a scan circuit according to some embodiments.

FIG. 3 is a diagram of a Domino scan circuit according to some embodiments. Circuit 100 converts a Domino SDL such as SDL 1 to a SDL that can be controlled and observed using a scan chain. Accordingly, circuit 100 will be referred to herein as scan SDL 100.

As will be described in detail with respect to FIG. 4, scan SDL 100 may be deployed at the termination of one clock cycle's worth of functional logic so as to store a data value generated by the functional logic. The data value is input to scan SDL 100 on the Data signal line, and the data value is latched by scan SDL 100 in response to a Domino clock signal that is input to the Dclk signal line. In this regard, the Dclk signal line carries the Dclk phase 1 Domino clock because scan SDL 100 is a phase 1 SDL. If scan SDL 100 were used as a phase 2 SDL, the Dclk signal line would carry the Dclk# phase 2 Domino clock. Scan SDL 100 may also be employed at the end of a Domino phase, or at a junction between Domino logic and static logic.

Scan SDL 100 uses two scan clock signals, Aclk and Bclk, to shift data values through a scan chain to which scan SDL 100 belongs. The Aclk signal is received by master latch 110 and controls the storage of a data value therein. Similarly, the Bclk signal is received by slave latch 120 and controls the storage of a data value in slave latch 120. As shown, slave latch 120 stores data using full static keeper 121. Slave latch 120 also includes pass gate 122 to pass the data value to full static keeper 121.

The Data signal line is held high and the Clk signal line is held low during scan procedures to avoid contention with the functional logic path during the scan process. In a first scan procedure, a scan value is stored in scan SDL 100 (and therefore present on the Q signal line) by applying the scan value to the Sin signal line, by holding the Bclk signal line low, and by transmitting a rising clock edge on the Aclk signal line.

To shift out a data value stored by scan SDL 100, the Aclk signal line is held low and a rising clock edge is transmitted on the Bclk signal line. Again, the Data signal line is held high and the Dclk signal line is held low during this latter scan procedure. The timing of signals used to operate scan SDL 100 will be described in more detail below with respect to FIG. 5.

Figure 4:
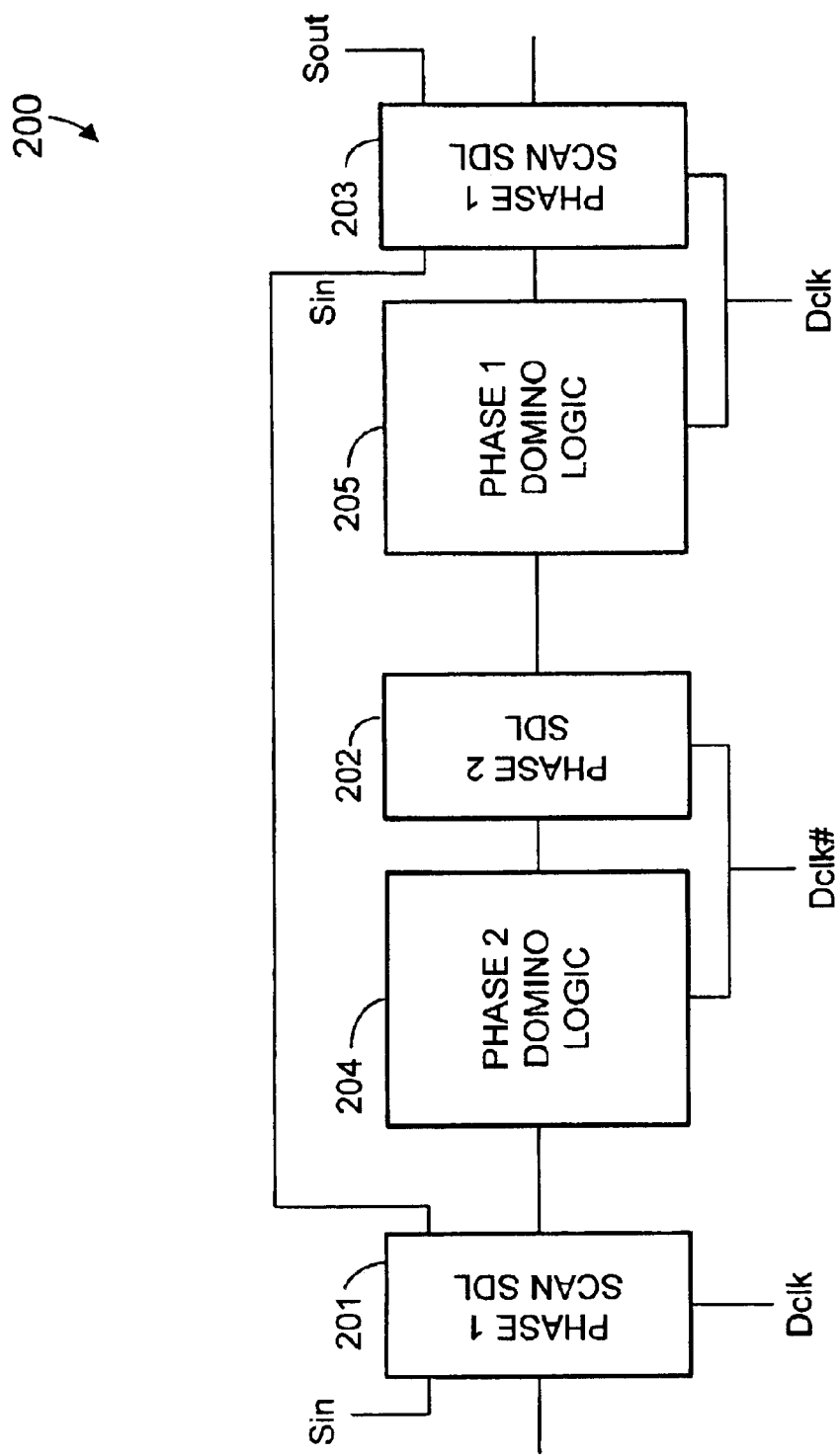
FIG. 4 is a block diagram of a Domino functional logic path with scan according to some embodiments.

FIG. 4 is a block diagram of a portion of a functional logic path including instances of scan SDL 100 according to some embodiments. Portion 200 includes SDLs 201 through 203. SDLs 201 and 203 are scan SDLs and therefore may be implemented by scan SDL 100 of FIG. 3. SDLs 201 and 203 are also phase 1 SDLs and therefore receive the Dclk signal. In contrast, SDL 202 is a phase 2 SDL that receives the Dclk# signal and does not provide scan functionality.

As shown, SDL 202 receives an output signal from phase 2 Domino logic 204 and SDL 203 receives an output signal from phase 1 Domino logic 205. Phase 2 Domino logic 204 and phase 1 Domino logic 205 may comprise any blend of combinational logic, including Domino logic and static logic. Any Domino logic within phase 2 Domino logic 204 is clocked by the Dclk# signal, and any Domino logic within phase 1 Domino logic 205 is clocked by the Dclk signal. Static logic located within logic blocks 204 and 205 is pure combinational logic that does not require a clock.

Figure 5:
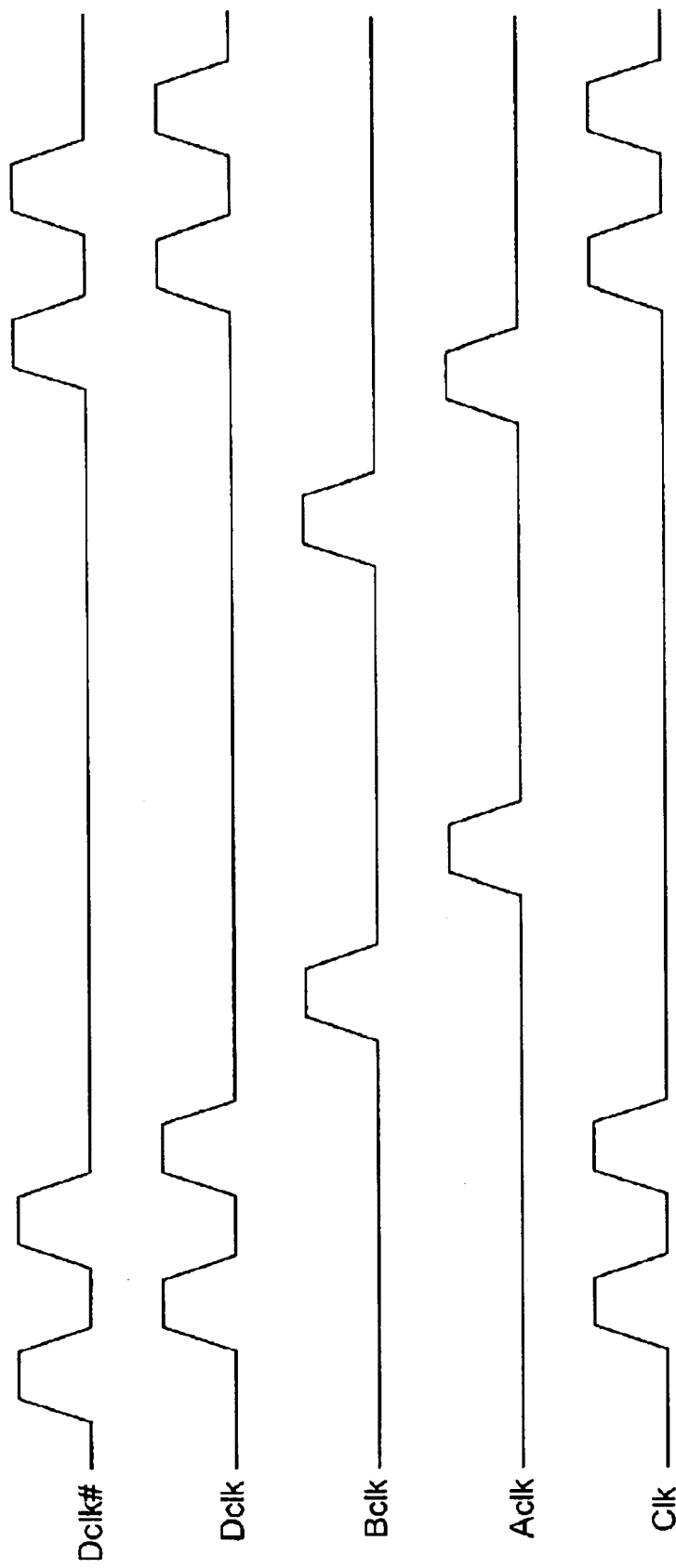
FIG. 5 is a timing diagram of clock signals to provide scan functionality in Domino according to some embodiments.

FIG. 5 is a timing diagram of signals used to store scan values into phase 1 SDLs 201 and 203, to propagate the scanned values through phase 2 domino logic 204 and phase 1 domino logic 205, and to read out the propagated values. Initially, the Dclk and DCLK# signals are held low. Such action holds Domino circuits of path 200 at a precharged state. In addition, this action generates a high signal on the Data signal lines of SDLs 201 and 203. As described with respect to FIG. 3, the resulting state of SDLs 201 and 203 allows scan values to be stored in and shifted out of SDLs 201 and 203.

Scan values are stored in SDLs 201 and 203 by applying the values to the Sin signal line while transmitting a rising edge on the Aclk signal line. After this storage, the Dclk# signal is toggled followed by the Dclk signal as shown in FIG. 5. Toggling the Domino clock signals allows the stored scan values to propagate to a next phase 1 SDL of portion 200. The propagated values are then shifted out by toggling the Bclk signal and the Aclk signal twice while the Dclk and Dclk# signals are held low, as also shown in FIG. 5. Toggling of the Aclk serves to store new scan values in phase 1 SDLs 201 and 203 before the process begins again.

If a scan SDL terminates a Domino data path and feeds into static logic, then it may be beneficial to clock the global system clock simultaneously with the Dclk signal as shown in FIG. 5 to allow stored data values to propagate to a next cycle boundary state element. FIG. 5 also shows that signals Aclk and Bclk are independent and non-overlapping, and run at a slower speed than the global system clock. Such features may allow these signals to be controlled by a conventional ATE that also transmits scan values to SDLs 201 and 203.

Figure 6:
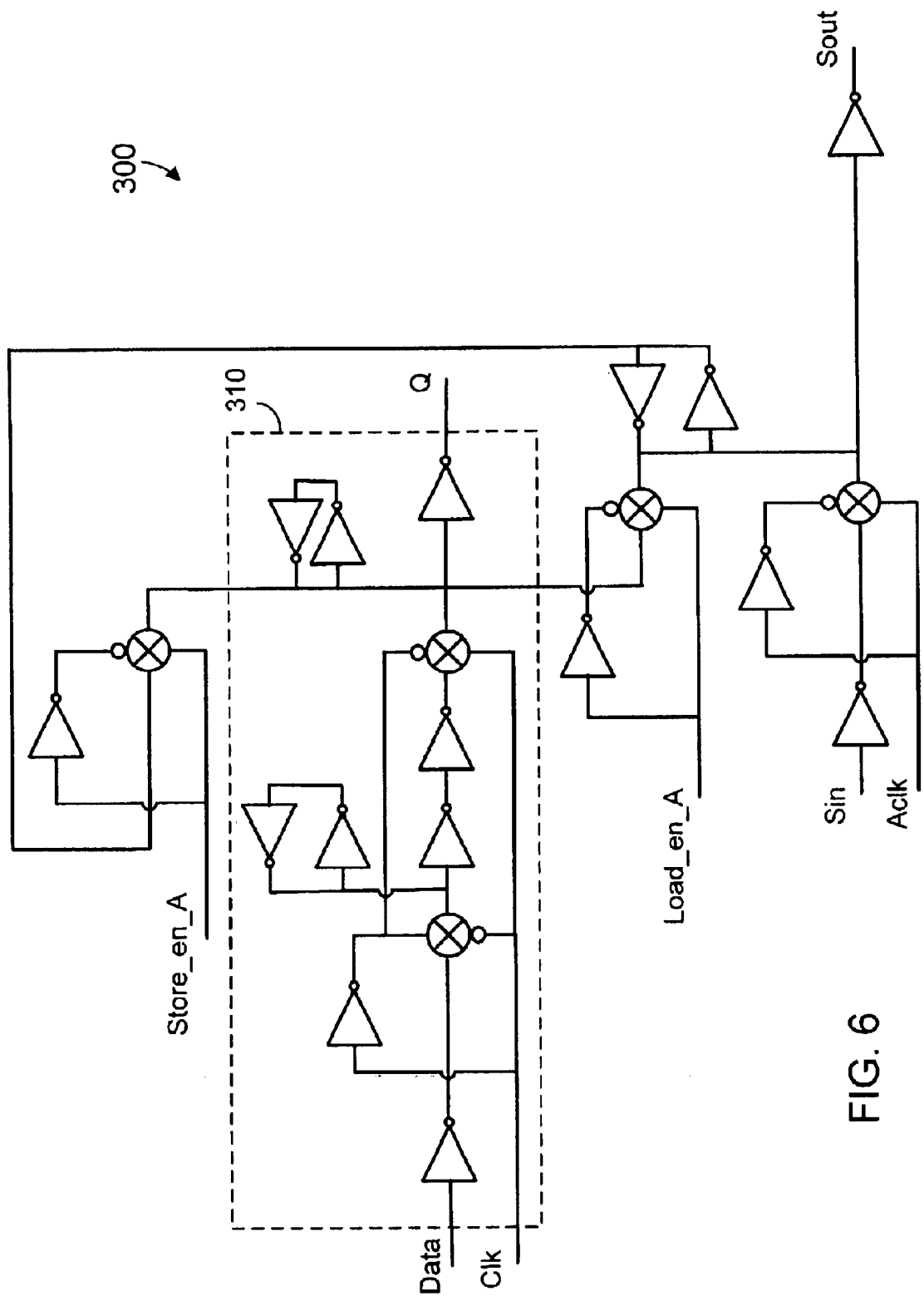
FIG. 6 is a diagram of a master scan cell according to some embodiments.
Figure 7:
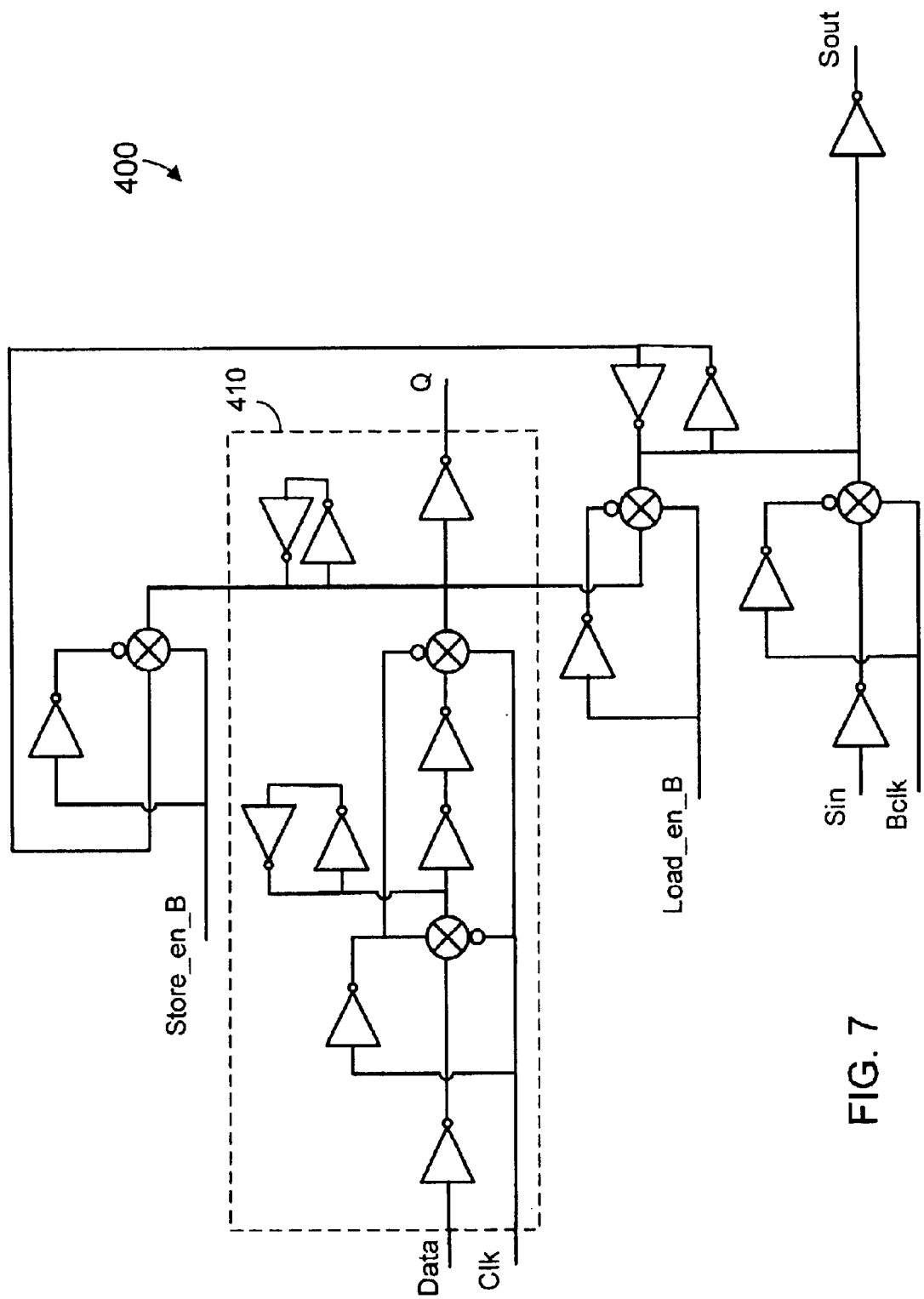
FIG. 7 is a diagram of a slave scan cell according to some embodiments.

FIGS. 6 and 7 are diagrams of master and slave scan cells, respectively. Master scan cell 300 includes state element 310 for storing data generated by functional logic that is coupled thereto. More specifically, the Data signal line of state element 310 is coupled to a functional node (not shown in FIG. 6) and receives a signal representing a data value from the functional node. The data value is stored in state element 310 (and present on the Q signal line) once a rising edge is received on the Clk signal line.

As shown, master scan cell 300 also receives a Store_en_A signal, a Load_en_A signal, an Sin signal, and an Aclk signal. In one operation, a scan value is stored in master scan cell 300 by enabling the Store_en A_signal, by applying the scan value to the Sin signal line and by transmitting a rising clock edge on the Aclk signal line while the Data signal line is held active and the Clk signal line is held inactive. In another operation, a data value stored by state element 310 may be shifted out to scan circuitry by enabling the Load_en_A signal. Due to the independence of master scan cell 300, the Data and Clk signal lines need not be manipulated during the "store" operation. Such a feature may provide an ability to capture a "snapshot" of the state of state element 310.

Slave scan cell 400 of FIG. 7 is similar to master scan cell 300. The Data signal line of state element 410 is also coupled to a functional node (not shown in FIG. 7) and receives a signal representing a data value from the functional node. As will be described with respect to FIG. 8, the functional nodes to which master scan cell 300 and slave scan cell 300 are coupled may be sequential within a functional circuit.

The Store and Load operations of slave scan cell 400 are analogous to those described above with respect to master scan cell 300. Of course, the Store_en_A, Load_en_A, and Aclk signals of the description should be substituted with the Store_en_B, Load_en_B, and Bclk signals received by slave scan cell 400.

Figure 8:
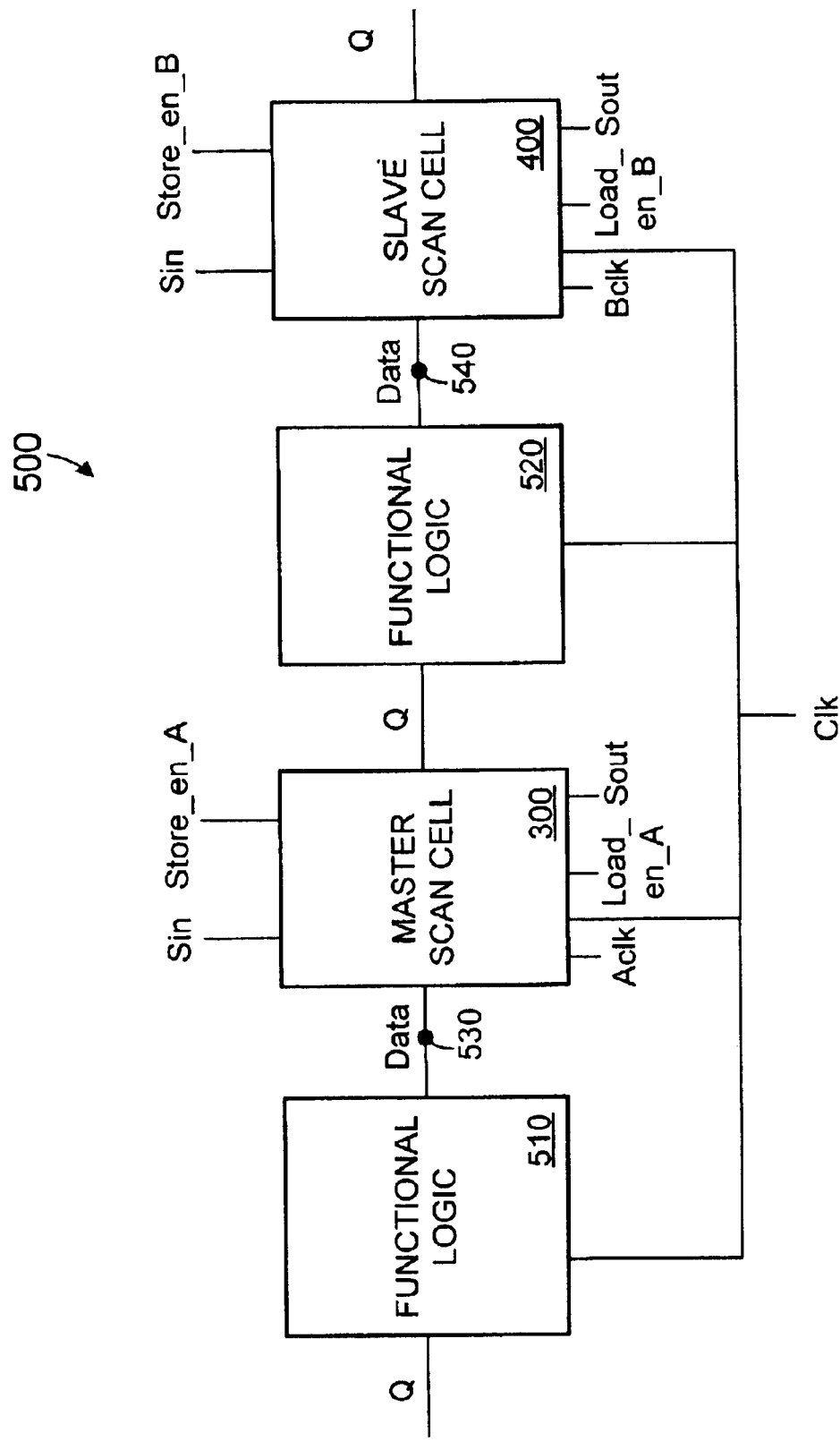
FIG. 8 is a block diagram of a functional logic path with scan according to some embodiments.

FIG. 8 is a block diagram of a functional logic path according to some embodiments. As shown, path 500 includes scan capability. This capability is provided by instances of master scan cell 300 and slave scan cell 400. Path 500 also includes functional logic 510 and functional logic 520. Master scan cell 300 is coupled to functional logic 510 at node 530 and slave scan cell 400 is coupled to functional logic 520 at node 540. As shown, node 530 and node 540 are sequential.

Two consecutive store operations are performed in order to store scan values into path 500. More specifically, the Aclk and Bclk signals are alternately toggled once to shift stored scan values, a scan value is stored in master scan cell 300 as described above, and the same scan value is stored in slave scan cell 400 as described above. In order to store data into nodes 530 and 540, the Store_en_A signal is enabled, the Aclk and Bclk signals are alternately toggled, and the Store_en_B signal is then enabled.

To load (capture) stored data into a scan circuit, two consecutive load operations are performed. First, a load operation is performed using master scan cell 300. Next, values of the entire scan circuit are shifted out by alternately toggling Aclk and Bclk once for each node in the scan circuit. A load operation is then performed using slave scan cell 400 and the values of the entire scan circuit are again shifted out. Since the toggling of the Aclk and Bclk signals shifts data through two scan chain elements, the scan chain of path 500 appears to operate at twice the frequency of the scan clock. Consequently, two consecutive load operations will require an amount of time similar to that required by a traditional scan circuit to load scan values.

The above-described snapshot capability provides visibility of all nodes that are coupled to any master scan cell in a scan circuit or, alternatively, of all nodes that are coupled to any slave scan cell in the scan circuit. Due to the independence of master scan cell 300 and slave scan cell 400 from the functional logic path, the nodes may be visible even while the functional logic is processing data signals.

Figure 9:
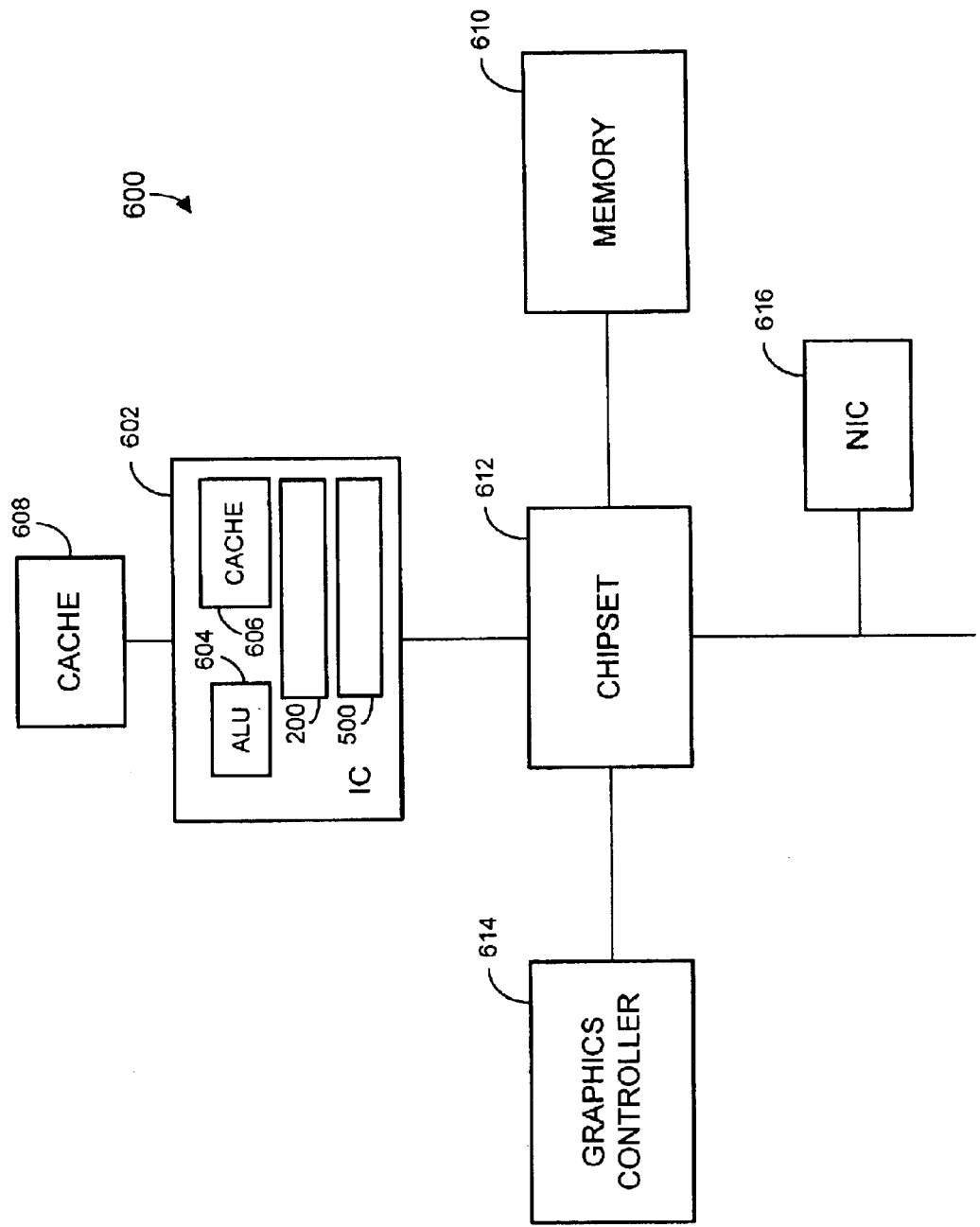
FIG. 9 is a block diagram of a system according to some embodiments.

FIG. 9 illustrates a block diagram of system 600 according to some embodiments. System 600 includes an integrated circuit 602 comprising sub-blocks such as arithmetic logic unit (ALU) 604, on-die cache 606, portion 200 and path 500. Portion 200 and path 500 may be used to test functional circuits locate within integrated circuit 602. Integrated circuit 602 may be a microprocessor or another type of integrated circuit. According to some embodiments, integrated circuit 602 also communicates with off-die cache 608. Integrated circuit 602 may also communicate with system memory 610 via a host bus and chipset 612. Other off-die functional units, such as graphics controller 614 and Network Interface Controller (NIC) 616, may communicate with integrated circuit 602 via appropriate busses or ports.

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

What is claimed is:

1. A circuit comprising:
   a Domino state element to receive a data signal;
   a master latch to receive a first clock signal and to store a value in the Domino state element in response to the first clock signal; and
   a slave latch to receive a second clock signal and to output the value in response to the second clock signals,
   wherein the Domino state element is to receive a third clock signal,
   and wherein the data signal is to be active and the third clock signal is to be inactive when the master latch is to store the value and when the slave latch is to output the value.

2. A circuit according to claim 1, wherein the slave latch comprises a full static keeper.

3. A circuit according to claim 2, wherein the slave latch further comprises a pass gate to pass a second value to the full static keeper in response to the second clock signal, the second value to represent the value.

4. A circuit according to claim 1, wherein the master latch comprises a first input to receive the value and a second input to receive the first clock signal.

5. A circuit according to claim 4, wherein the slave latch further comprises a pass gate to pass the value to a storage node in response to the second clock signal.

6. A circuit according to claim 1, further comprising:
   a first combinational logic block coupled to the Domino state element and to receive a third clock signal,
   wherein the Domino state element is to receive the third clock signal and to store a second value generated by the first combinational logic block.

7. A circuit according to claim 6, further comprising:
   a second Domino state element to receive a fourth clock signal;
   a second master latch to receive the first clock signal and to store a third value in the second Domino state element in response to the first clock signal;
   a second slave latch to receive the second clock signal and to output the third value in response to the second clock signal; and
   a second combinational logic block coupled to the first Domino state element and to the second Domino state element, and to receive the fourth clock signal,
   wherein the fourth clock signal is a complement of the third clock signal.

8. A method comprising:
   applying an active slave clock signal to a slave latch coupled to a Domino state element to output a first value stored in the Domino state element;
   applying an active master clock signal to a master latch coupled to the Domino state element to store a second value in the Domino state element; and
   applying, during the step of applying the active master clock signal to the master latch, a scan value signal representing the second value to the master latch while applying an active data signal to a data terminal of the Domino state element and applying an inactive clock signal to a clock terminal of the Domino state element.

9. A method according to claim 8, further comprising:
   applying the active slave clock signal to the slave latch to output the second value.

10. A method according to claim 8, further comprising:
    applying an active data signal to a data terminal of the Domino state element and applying an inactive clock signal to a clock terminal of the Domino state element during the step of applying the active master clock signal to the master latch and the step of applying the active slave clock signal to the slave latch.

11. A circuit comprising:
    a first state element coupled to a first node;
    a master scan cell coupled to the first state element, the master scan cell to receive a first storage signal, a first load signal, a first clock signal and a first scan value signal, the master scan cell to receive a first value from the first scan value signal and to store the first value at the first node in response to the first storage signal and the first clock signal;
    a second state element coupled to a second node, the second node sequential to the first node; and
    a slave scan cell coupled to the second state element, the slave scan cell to receive a second storage signal, a second load signal, a second clock signal and a second scan value signals, the slave scan cell to receive a second value from the second scan value signal and to store the second value at the second node in response to the second storage signal and the second clock signal.

12. A circuit according to claim 11, wherein the master scan cell loads a first value stored by the first state element into a scan chain in response to the first load signal, and
    wherein the slave scan cell loads a second value stored by the second state element into the scan chain in response to the second load signal.

13. A circuit according to claim 11, wherein the circuit comprises a hold scan cell.

14. A system comprising:

a chipset; and a die comprising a microprocessor in communication with the chipset, wherein the microprocessor includes a circuit comprising:

a Domino state element;

a master latch to receive a first clock signal and to store a value in the Domino state element in response to the first clock signal; and a slave latch to receive a second clock signal and to output the value in response to the second clock signals, wherein the Domino state element is to receive a data signal and a third clock signal, and wherein the data signal is to be active and the third clock signal is to be inactive when the master latch is to store the value and when the slave latch is to output the value.

15. A system according to claim 14, wherein the slave latch comprises a full static keeper.

16. A system according to claim 15, wherein the slave latch further comprises a pass gate to pass a second value to the full static keeper in response to the second clock signal, the second value to represent the value.

17. A system according to claim 14, the circuit further comprising:

a first combinational logic block coupled to the Domino state element and to receive a third clock signal, wherein the Domino state element is to receive the third clock signal and to store a second value generated by the first combinational logic block.

18. A system according to claim 17, the circuit further comprising:

a second Domino state element to receive a fourth clock signal;

a second master latch to receive the first clock signal and to store a third value in the second Domino state element in response to the first clock signal;

a second slave latch to receive the second clock signal and to output the third value in response to the second clock signal; and a second combinational logic block coupled to the first Domino state element and to the second Domino state element, and to receive the fourth clock signal, wherein the fourth clock signal is a complement of the third clock signal.

19. A system comprising:

a chipset; and a die comprising a microprocessor in communication with the chipset, wherein the microprocessor includes a circuit comprising:

a first state element coupled to a first node;

a master scan cell coupled to the first state element, the master latch to receive a first storage signal, a first load signal, a first clock signal and a first scan value signal, the master scan cell to receive a first value from the first scan value signal and to store the first value at the first node in response to the first storage signal and the first clock signal;

a second state element coupled to a second node, the second node sequential to the first node; and a slave scan cell coupled to the second state element, the slave latch to receive a second storage signal, a second load signal, a second clock signal and a second scan value signal, the slave scan cell to receive a second value from the second scan value signal and to store the second value at the second node in response to the second storage signal and the second clock signal.

20. A system according to claim 19, wherein the master scan cell loads a first value stored by the first state element into a scan chain in response to the first load signal, and wherein the slave scan cell loads a second value stored by the second state element into the scan chain in response to the second load signal.

* * * * *